(12) United States Patent
Boivin

(10) Patent No.: US 6,590,256 B2
(45) Date of Patent: *Jul. 8, 2003

(54) EEPROM CELL TESTING CIRCUIT

(75) Inventor: Philippe Boivin, Venelles (FR)

(73) Assignee: STMicroelectronics S.A., Gentilly (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/447,977

(22) Filed: Nov. 23, 1999

(65) Prior Publication Data

US 2002/0190310 A1 Dec. 19, 2002

(30) Foreign Application Priority Data

Nov. 27, 1998 (FR) .............................. 98 15149

(51) Int. Cl.⁷ ..................... H01L 29/788; H01L 23/544
(52) U.S. Cl. ..................................... 257/318
(58) Field of Search ................... 257/318, 797, 257/622

(56) References Cited

U.S. PATENT DOCUMENTS

| | | | |
|---|---|---|---|
| 4,543,647 A | 9/1985 | Yoshida | 365/201 |
| 4,924,278 A | * 5/1990 | Logie | 29/78 |
| 4,963,825 A | 10/1990 | Mielke | 324/158 R |
| 5,297,087 A | 3/1994 | Porter | 365/201 |
| 5,712,816 A | * 1/1998 | Cappelletti et al. | 365/185 |

* cited by examiner

Primary Examiner—Stephen D. Meier
(74) Attorney, Agent, or Firm—Wolf, Greenfield & Sacks, P.C.; James H. Morris

(57) ABSTRACT

A testing circuit made on a silicon wafer including a plurality of identical cells, each of which includes a primary capacitor of given characteristics, which includes a test capacitor of same characteristics as each primary capacitor and of surface at least equal to the sum of the surfaces of the primary capacitors.

19 Claims, 3 Drawing Sheets

EEPROM CELL TESTING CIRCUIT

BACKGROUND OF THE INVENTION

1. Field of the Invention

The present invention relates to the testing of integrated circuits and especially to the testing of EEPROM cells.

2. Discussion of the Related Art

Many electronic circuits use EEPROM cells to temporarily store data. FIG. 1 shows a simplified diagram of an EEPROM cell 10, which includes an N-channel MOS transistor 12, the source 13' of which is connected to the drain 13" of a floating gate MOS transistor 14. When several cells 10 are arranged in an array, drain 16 and gate 18 of a transistor 12 are, for example, respectively connected to a bit line and to a word line. The source of transistor 14 is connected to a reference terminal 20. Control gate 22 is connected to a control line 23. The floating gate is designated by reference 24.

FIGS. 2A and 2B respectively show a top view and a cross-section view of an embodiment of an EEPROM cell 10. Same references designate same elements as in FIG. 1. Cell 10 is formed on a lightly-doped P-type substrate 11. The gate of transistor 12, made of polysilicon, extends above an area separating two N-type doped regions, forming drain 16 and source 13' of transistor 12. Gate 18 is separated from substrate 11 by silicon oxide 11'. Floating gate 24 of transistor 14, made of polysilicon, includes a main portion which extends above a heavily-doped N-type region forming control gate 22. The main portion of the floating gate is separated from area 22 by an oxide 22'. Floating gate 24 further includes two doped regions forming drain 13" and source 20 of transistor 14. A second finger extends above a heavily-doped N-type region 25, connected to drain 13". A thin oxide area 26 is located between the second finger of floating gate 24 and region 25, which forms a tunnel capacitor C2 between drain 13" and floating gate 24. The writing of data into cell 10 corresponds to the injection of charges into floating gate 24 through tunnel capacitor C2 by the Fowler-Nordheim effect. The operation of cell 10 is, conventional and will not be further described herein.

FIG. 3 schematically shows a portion of a semiconductor wafer on which several chips 27, each including a great number of EEPROM cells 10, have been manufactured. Chips 27 are separated by chip cutting areas. It is important, before selling each of chips 27, to test the quality of all its EEPROM cells 10. In particular, the quality and aging stability of all tunnel capacitors C2 of EEPROM cells 10 is desired to be tested. Indeed, the oxide of the tunnel capacitors is very thin and its quality is critical for the cell operation. If, for any reason, for example, poor manufacturing, the tunnel oxide of at least one of capacitors C2 of a cell 10 of a circuit 11 is defective, the oxide can be punctured and develop a short-circuit after several write and read operations, and make circuit 27 non-functional. A conventional method to test the proper aging of all tunnel capacitors C2 consists of performing a great number of write and read operations in each of cells 10. This type of testing is extremely expensive and it can damage the tested structures. Another method consists of making test cells identical to the memory cells and of testing the aging thereon. However, if the number of test cells is limited, the obtained results may not be reliable. Indeed, if the probability of the defect is small, the analysis of the performances of a small number of test cells is insufficient to predict the performance of a great number of memory cells. It is possible to increase the value of this test by increasing the number of test cells, but the space taken by the test cells becomes significant, which is expensive. It thus appears to be impossible to perform a testing which properly reflects the quality of the tunnel oxide of all the floating gate transistors of an EEPROM memory of a chip.

SUMMARY OF THE INVENTION

An object of the present invention is to provide a test cell that provides a reliable indication of the quality of all the EEPROM cells of a chip.

Another object of the present invention is to provide such a test cell which can be implemented without increasing the size of the chip and without any additional cost.

To achieve these and other objects, the present invention provides a testing circuit made on a silicon wafer including a plurality of identical cells, each of which includes a primary capacitor of given characteristics, which includes a test capacitor of same characteristics as each primary capacitor and of surface at least equal to the sum of the surfaces of the primary capacitors.

According to an embodiment of the present invention, each cell includes several primary capacitors of distinct types, and the testing circuit includes a number of test capacitors equal to the number of primary capacitors of each cell, each test capacitor having the same characteristics as the primary capacitors of a given type, the test capacitors being interconnected like the primary capacitors.

According to an embodiment of the present invention, the testing circuit is formed on a wafer, the cells of which are EEPROM cells, each including three primary capacitors corresponding to a capacitor between the floating gates and of control series-connected with a tunnel capacitor, itself connected in parallel with a capacitor between the floating gate and the substrate, and which includes three test capacitors.

According to an embodiment of the present invention, the testing circuit is located on an area of the wafer in which a separation cutting of the chips is performed.

According to an embodiment of the present invention, the testing circuit is reproduced several times on the wafer according to a homogeneous distribution.

The foregoing as well as other objects, features and advantages of the present invention will be discussed in detail in the following non-limiting description of an embodiment-of the present invention in connection with the accompanying drawings.

DETAILED DESCRIPTION

According to a first aspect of the present invention, a test capacitor having characteristics identical to those of each of the tunnel capacitors but with a much larger surface is implanted in the cutting area of a chip including a great number of components, each of which includes a tunnel capacitor. Each element (isolator, electrode, etc.) of the test capacitor is manufactured at the same time as the corresponding element of the tunnel capacitors of the chip. The surface of the tunnel oxide of the test capacitor is preferably at least equal to the sum of the surfaces of the tunnel oxides of the chip. Thus, statistically, if a defect exists in a cell of the chip, a defect will exist at one point of the test capacitor. The test includes repeatedly injecting into the test capacitor an amount of charge corresponding to the sum of the charges crossing, in operation, the oxide of each of the tunnel capacitors of the chip, and of studying the aging of the oxide of the test capacitor. The repeated injections of charges result in a puncture of the tunnel oxide of the test capacitor if said capacitor has any defect. Thus, when the test capacitor is not damaged after a predetermined number of test cycles, there is statistically no reason for the tunnel capacitor of one of the memory cells of the adjacent chip to be defective.

However, during the test, it appears to be difficult to reproduce in the test capacitor the operating conditions of the component capacitors. Problems are especially encountered to apply and measure test signals with the same impedances as for the signals applied to the real cells. Such problems can result in a puncture of the tunnel oxide of the test capacitor even in the absence of defects.

According to a second aspect of the present invention, as many test capacitors as there are primary capacitors in the equivalent capacitive circuit of any of the floating gate transistors are implanted in the vicinity of a chip including a great number of floating gate transistors. Each test capacitor has the same characteristics as the corresponding capacitor of the equivalent capacitive circuit of any of the floating gate transistors. As previously, each element (electrode, isolator, etc.) of the test capacitors is manufactured at the same time as the same elements of the corresponding capacitors of the chip. Similarly, the surface of the oxide of each test capacitor is preferably at least equal to the sum of the surfaces of the oxides of the corresponding capacitors of the chip. Further, the test capacitors are interconnected like the corresponding capacitors of the equivalent capacitive circuit of any of the floating gate transistors. The testing circuit thus formed remains of sufficiently reduced size to be implanted in the cutting area of the chip. It especially enables testing the tunnel oxide in conditions very close to those of the normal operation of the circuit cells.

Figure 1:
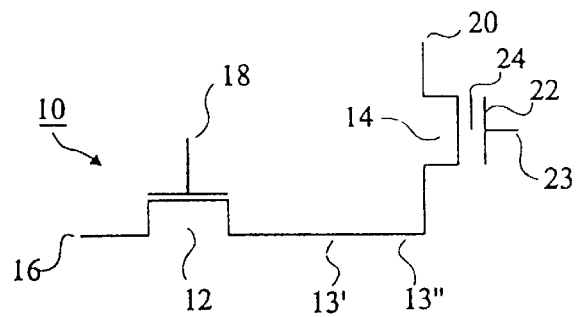
FIG. 1, previously described, shows a simplified electric diagram of an EEPROM cell.
Figure 2A:
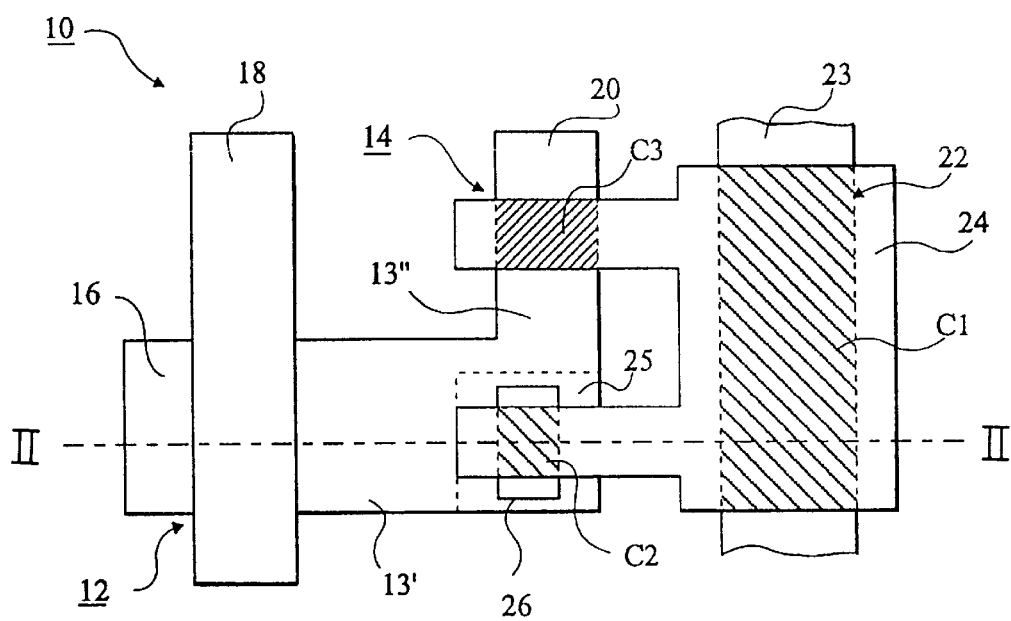
FIGS. 2A–2B, previously described, show top and cross-section views of an EEPROM cell.
Figure 2B:
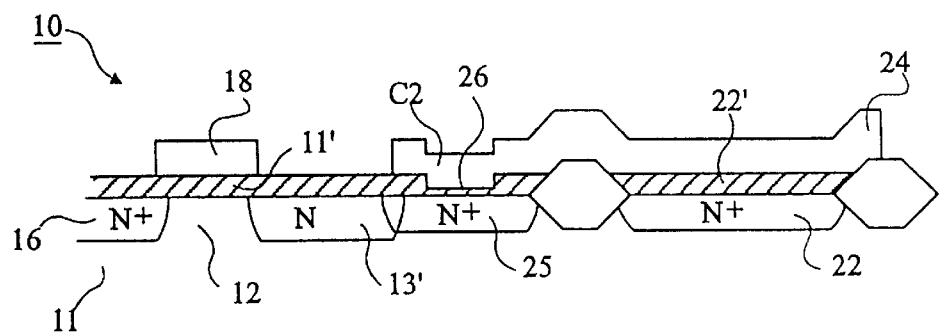
Figure 3:
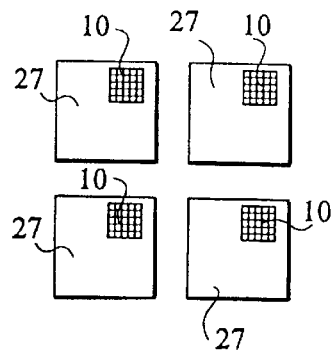
FIG. 3, previously described, illustrates the implantation on a semiconductor wafer of circuits including EEPROM cells.
Figure 4:
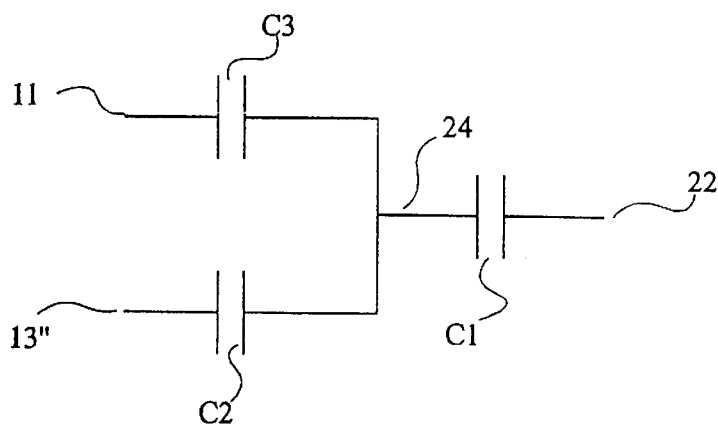
FIG. 4 shows an equivalent diagram of the capacitors of the floating gate transistor of FIG. 1.

The same references refer to the same elements in the following drawings; FIG. 4 shows the electric diagram of the equivalent capacitive circuit of a floating gate transistor 14. A capacitor C1 between floating gate 24 and control gate 22 is connected to previously-described tunnel capacitor C2, located between floating gate 24 and drain 13". Floating gate 24 is also connected to substrate 11 of transistor 14 by a capacitor C3.

Figure 5:
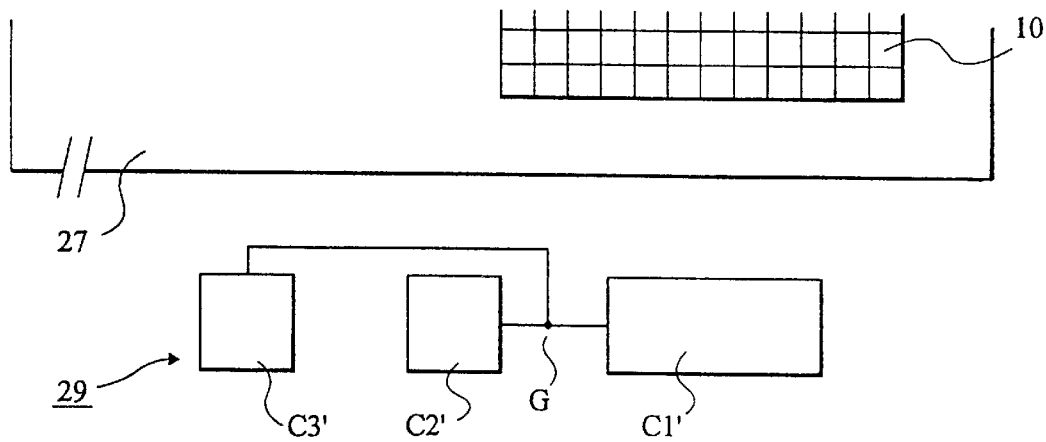
FIG. 5 shows a simplified top view of an embodiment of a testing circuit according to the present invention.
Figure 6:
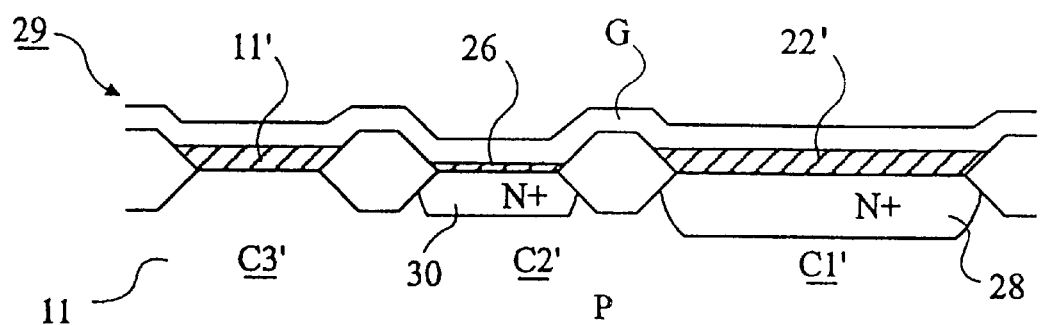
FIG. 6 shows a cross-section view of the circuit of FIG. 5.

FIGS. 5 and 6 show a simplified top view and a cross-section view of a testing circuit 29 located in the cutting area of a chip 27 including a great number of cells 10, each of which corresponds to the equivalent circuit of FIG. 4. Circuit 29 includes a capacitor C1' connected in series with two capacitors C2' and C3' connected in parallel. Reference G designates the node located between capacitor C1' and capacitors C2' and C3'. Node G is equivalent to floating gate 24 of transistors 14. Node G can be accessible, conversely to the floating gate of a transistor 14, which eases test measurements. Testing circuit 29 enables directly reproducing the voltages and current which are applied to the capacitors of all memory cells of chip 27 in normal operation, and measuring the effect of these voltages and currents upon the capacitors. Each of the elements of capacitors C1', C2', and C3' is formed at the same time as the corresponding element of respective capacitors C1, C2, C3. Especially, .the dielectric layer of each of capacitors C1', C2', C3' is respectively identical to the dielectric layer of each of capacitors C1, C2, C3. However, the surface of the dielectric of each of capacitors C1', C2', C3' is much greater than that of each of the primary capacitors. For example, the surface of the dielectric of capacitor C1' is equal to the sum of the dielectric surfaces of each of capacitors C1 of the cells of a chip; and the surfaces of capacitors C2' and C3' are in the same proportion with respect to those of capacitors C2 and C3.

As better appears from FIG. 6, capacitor C1' is formed of a polysilicon layer G which extends, isolated by an oxide layer 22', above a heavily-doped N-type well 28. Capacitor C2' is formed by layer G which extends, isolated by a tunnel oxide layer 26, above a heavily-doped N-type well 30. Capacitor C3' is formed by layer G which extends, isolated by an oxide layer 11', above substrate 11 of the chip. Oxides 22', 26, and 11' are formed at the same time, respectively in capacitors C1', C2', and C3' and C1, C2, and C3. As an example, oxide 22' may have a thickness from 15 to 30 nm and oxide 26 may have a thickness under 10 nm. Oxide 11' generally is of the same order of thickness as oxide 22'. In practice, test cell 29 has a sufficiently reduced size to be placed in the cutting area separating two chips 27. A test cell 29 can thus be formed for each chip of memory circuit 27.

Figure 7:
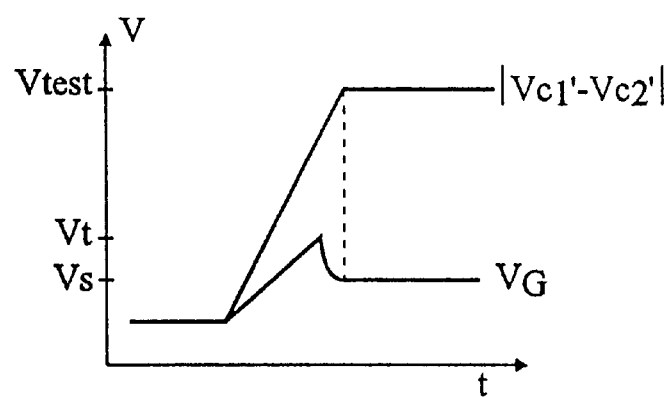
FIG. 7 illustrates the test mode of the circuit of FIGS. 5 and 6.

FIG. 7 shows a voltage VC1'–VC2' applied according to a test mode between well 30 and well 28, and the resulting gate voltage VG. The voltage between well 28 and well 30, that is, the absolute value of voltage difference VC1'–VC2', is increased according to a current ramp. Floating gate voltage VG increases by capacitive coupling to reach a first threshold voltage Vt. Then, by Fowler-Nordheim effect, a charge injection into capacitor C2' and a drop of gate voltage VG to a second threshold voltage Vs depending on the thickness of the tunnel oxide occur. This is a phenomenon of balance between the applied voltage and the law of current transportation in the oxide. The voltage ramp is brought to a predetermined value Vtest sufficient for voltage VG to reach second threshold voltage Vt. During this testing, the charges injected into floating gate G are injected in the same conditions as the charges injected into floating gates 24 of the primary cells in normal operation. Thus, circuit 29 enables testing the quality of the tunnel oxide over the entire capacitor C2' in the desired operating conditions. If the smallest defect is present at the surface of capacitor C2', it will cause a puncture of the tunnel oxide after having been crossed by a given amount of charges. At the end of the testing, the electric integrity of the capacitances can be tested and capacitance C2' or thresholds Vt and Vs can be measured to check that the tunnel oxide has not been damaged. If capacitor C2' is not damaged, it is assumed that capacitors C2 of the tested chip have no statistical reasons to exhibit defects.

Those skilled in the art will have not difficulty in using testing circuit 29 to statistically measure various characteristics of the EEPROM cells of the tested chip, as well as the variation of the programmability or of the hold of the cell charge after the accelerated aging obtained by the test cycles.

Of course, the present invention is likely to have various alterations, modifications, and improvements which will readily occur to those skilled in the art. For example, the present description relates to a test cell, the capacitors of which are each equal to the sum of the capacitors of a memory cell, but it may also be envisaged that the capacitors of the test cell have a surface greater than the sum of the surfaces of the capacitors of all the cells to be tested. It will then however be necessary to maintain, between the test capacitors, the surface ratios existing between the capacitors of a memory cell to maintain a capacitive coupling identical to that of each of the primary cells.

Similarly, each of test capacitors C1', C2', C3' may be formed, each, in the form of a few capacitors of reduced size connected in parallel, which will enable performing other tests, such as interface tests between different areas, for example, to evaluate different problems of coverage of the tunnel oxide by conductive layer G. Although the preceding description aims at an example of application of the present invention to EEPROM memory cells, it should be noted that the present invention generally aims at a mode of testing an integrated circuit including identical elements, each of which includes one or several capacitors. Although, in the described embodiment, the various capacitors have silicon oxide as a dielectric, it should be noted that the present invention applies whatever the dielectric used.

Such alterations, modifications, and improvements are intended to be part of this disclosure, and are intended to be within the spirit and the scope of the present invention. Accordingly, the foregoing description is by way of example only and is not intended to be limiting the present invention is limited only as defined in the following claims and the equivalents thereto.

What is claimed is:

1. A testing circuit made on a silicon wafer including a plurality of identical cells, each identical cell including a primary capacitor having given characteristics, comprising:

a test capacitor having characteristics substantially similar to the given characteristics of each primary capacitor and having a surface area at least equal to a sum of surface areas of the primary capacitors.

2. The testing circuit of claim 1, wherein each of the plurality of identical cells has a number of primary capacitors of distinct types having given characteristics and having a configuration, further comprising:

a plurality of test capacitors, each capacitor in the plurality of capacitors respectively corresponding to a primary capacitor in each of the identical cells, each of the plurality of test capacitors having characteristics identical to the given characteristics of the primary capacitors of distinct types, the test capacitors having a configuration identical to the configuration of the primary capacitors.

3. The testing circuit of claim 2, wherein the plurality of identical cells are EEPROM cells including three primary capacitors corresponding to a floating gate, a tunnel capacitor, and a third capacitor, wherein the floating gate is control series-connected with the tunnel capacitor, and the tunnel capacitor connected in parallel with the third capacitor between the floating gate and a substrate, and wherein the testing circuit includes three test capacitors.

4. The testing circuit of any of claim 1, wherein the testing circuit is located on an area of the wafer in which a separation cutting of chips is performed.

5. The testing circuit of claim 4, wherein the testing circuit is reproduced several times on the wafer according to a homogeneous distribution.

6. A test circuit for testing an electric circuit having a plurality of identical cell structures having a primary capacitor with given characteristics, comprising:

a test capacitor having characteristics substantially similar to the given characteristics of the primary capacitor and a surface equal to at least the sum of all surfaces of the primary capacitors of all the identical cells.

7. The testing circuit of any of claim 6, wherein the test circuit is located on an area of a wafer in which a separation cutting of chips is performed.

8. The testing circuit of claim 6, wherein the test circuit is reproduced several times on a wafer according to a homogeneous distribution.

9. The test circuit of claim 6, wherein each of the plurality of identical cell structures further includes a plurality of secondary capacitors having given characteristics, further comprising:

a plurality of secondary test capacitors corresponding to the plurality of secondary capacitors in each of the identical cells, each of the plurality of secondary test capacitors having characteristics substantially similar to the given characteristics of corresponding secondary capacitors of each of the plurality of identical cell structures.

10. The test circuit of claim 9, wherein the test capacitor and the plurality of secondary test capacitors have a configuration identical to a configuration of the primary capacitor and the secondary capacitors of each of the plurality of identical cell structures.

11. The test circuit of claim 9, wherein the test capacitor and the plurality of secondary test capacitors are connected in parallel.

12. The test circuit of claim 9, wherein each of the plurality of test capacitors has a surface area at least equal to a sum of surface areas of corresponding secondary capacitors of each of the plurality of identical cell structures.

13. A method of testing comprising:

measuring a first characteristic of a test circuit;

applying to the testing circuit to a test voltage sufficient to cause tunneling in the testing circuit for a predetermined period of time;

measuring a second characteristic of the test circuit; and comparing the second characteristic to the first characteristic.

14. The method of claim 13 wherein the first characteristic is a first threshold voltage and the second characteristic is a second threshold voltage.

15. The method of claim 13, further comprising forming the test circuit in an area of a wafer in which a separation cutting of chips is performed.

16. The method of claim 13, further comprising reproducing the test circuit several times on a wafer according to a homogeneous distribution.

17. The method of claim 13, wherein the act of applying to the testing circuit to a test voltage sufficient to cause tunneling comprises applying to the testing circuit to a test voltage sufficient to cause Fowler-Nordheim tunneling.

18. The method of claim 13 wherein the first characteristic is a first capacitance of an element of the test circuit aid the second characteristic is a second capacitance of the element of the test circuit.

19. The method of claim 18, wherein circuit being tested is determined to be defective if the second capacitance is lower than the first capacitance.

* * * * *

UNITED STATES PATENT AND TRADEMARK OFFICE
CERTIFICATE OF CORRECTION

PATENT NO. : 6,590,256 B2  Page 1 of 1
DATED : July 8, 2003
INVENTOR(S) : Philippe It is certified that error appears in the above-identified patent and that said Letters Patent is hereby corrected as shown below:

Column 1,
Line 32, should read -- further includes two "fingers" from the main portion. A first finger extends above an area separating two N-type doped regions forming drain 13" and --

Column 4,
Line 5, should read -- capacitors of all memory cells 10 of chip 27 in normal --

Column 5,
Line 31, should read -- only and is not intended to be limiting. The present invention --

Column 6,
Line 60, should read -- is a first capacitance of an element of the test circuit and the --

Signed and Sealed this

Twenty-eighth Day of October, 2003

JAMES E. ROGAN
*Director of the United States Patent and Trademark Office*